United States Patent [19]
Urayama

[11] Patent Number: 5,851,869
[45] Date of Patent: Dec. 22, 1998

[54] MANUFACTURE OF SEMICONDUCTOR DEVICE HAVING LOW CONTACT RESISTANCE

[75] Inventor: Takehiro Urayama, Kawasaki, Japan

[73] Assignee: Fujitsu Limited, Japan

[21] Appl. No.: 719,399

[22] Filed: Sep. 24, 1996

Related U.S. Application Data

[62] Division of Ser. No. 466,078, Jun. 6, 1995, Pat. No. 5,600,167.

[30] Foreign Application Priority Data

Jul. 20, 1994 [JP] Japan ............................ HEI 6-168026

[51] Int. Cl.⁶ ................................................ H01L 21/8234
[52] U.S. Cl. .................. 438/238; 438/231; 148/DIG. 20
[58] Field of Search ..................... 438/231, 232, 438/233, 238; 148/DIG. 20; 257/903, 904

[56] References Cited

U.S. PATENT DOCUMENTS

| | | | |
|---|---|---|---|
| 4,734,383 | 3/1988 | Ikeda et al. ................................ 437/42 |
| 4,984,200 | 1/1991 | Saitoo et al. ............................. 365/154 |
| 5,278,082 | 1/1994 | Kawamura ................................ 437/29 |
| 5,317,197 | 5/1994 | Roberts .................................... 257/401 |
| 5,372,956 | 12/1994 | Baldi ......................................... 437/34 |
| 5,373,170 | 12/1994 | Pfiester et al. ............................ 257/69 |
| 5,418,179 | 5/1995 | Hotta ........................................ 437/57 |

Primary Examiner—Joni Chang
Attorney, Agent, or Firm—Armstrong, Westerman, Hattori, McLeland & Naughton

[57] ABSTRACT

A semiconductor device capable of stably operating even at a low voltage, incudes: a semiconductor substrate having a surface region of a first conductivity type; a conductive film directly formed on a surface of the surface region at an area thereof, the conductive film containing impurities of a second conductivity type opposite to the first conductivity type; an oozed diffusion region of the second conductivity type formed by diffusion of the impurities in the conductive film into the substrate, the oozed diffusion region being formed at an area contiguous to the conductive film in the surface region; a low resistivity region of the second conductivity type extending from an area adjacent to the conductive film in the surface region and overlapping the conductive film; and a DDD structure transistor formed on another region of the surface region, wherein a length of a portion of the low resistivity region overlapping the conductive film is substantially the same as a length of a portion of the deep source and drain regions of the DDD structure overlapping the gate electrode.

20 Claims, 5 Drawing Sheets

MANUFACTURE OF SEMICONDUCTOR DEVICE HAVING LOW CONTACT RESISTANCE

This is a division of application Ser. No. 08/466,078 filed Jun. 6, 1995, U.S. Pat. No. 5,600,167.

BACKGROUND OF THE INVENTION a) Field of the Invention

The present invention relates to a method of manufacturing a semiconductor device, and more particularly to a technique allowing a semiconductor integrated circuit to reliably operate at a low voltage.

b) Description of the Related Art

In connecting a region in a semiconductor substrate to a wiring formed on the substrate, a highly doped region is generally formed in the surface of the substrate, and thereafter a wiring is connected to the surface of the highly doped region. As the material of wiring, metal, silicide, doped silicon, and other materials are used.

If a wiring is made of polycrystalline silicon or amorphous silicon, a simplified connection structure may be adopted. Specifically, a silicon electrode is first formed on the surface of a semiconductor substrate, and thereafter ions are implanted in the silicon electrode and semiconductor substrate adjacent thereto. The doped silicon electrode and doped region of the substrate contact slightly at the interface therebetween. Heat treatment at the later process diffuses impurities in the doped silicon electrode and substrate region toward the non-doped region under the silicon electrode, and electrical interconnect therebetween is established.

The above processes are advantageous in that they can be performed at the same time when a gate of a MOS transistor is formed and then ions are implanted to the source and drain regions.

Recent semiconductor integrated circuits with very fine patterns have a demand for a low voltage operation of the circuits. As the operating voltage lowers, a voltage difference between high and low levels (logic swing) becomes small and the circuit operation becomes likely to become unstable.

A circuit may become unstable at a low voltage such as 3 V or 3.3 V even if it operates stably at an operating voltage of 5 V.

SUMMARY OF THE INVENTION

It is an object of the present invention to provide a semiconductor device manufacturing technique capable of providing a stable operation of a semiconductor integrated circuit even at a low voltage.

According to one aspect of the present invention, there is provided a semiconductor device including: a semiconductor substrate having a surface region of a first conductivity type; a conductive film directly formed on part of a surface of the surface region, the conductive film containing impurities of a second conductivity type opposite to the first conductivity type; an oozed diffusion or out-diffusion region of the second conductivity type formed by outward diffusion of the impurities in the conductive film, the oozed diffusion region being formed at an area contiguous to the conductive film in the surface region; a low resistivity region of the second conductivity type extending from an area adjacent to the conductive film in the surface region and overlapping the conductive film; and a double-diffused drain (DDD) structure transistor comprising a first gate electrode formed on a gate insulating film over a channel region defined by an area in the surface region, first source and drain regions of the second conductivity type formed on both sides of the first gate electrode, and second source and drain regions of the second conductivity type surrounding, and being formed deeper than, the first source and drain regions and overlapping the first gate electrode, wherein a length of a portion of the low resistivity region overlapping the conductive film is substantially the same as a length of a portion of the second source and drain regions overlapping the first gate electrode.

According to another aspect of the present invention, there is provided an SRAM semiconductor device including a parallel circuit of two serial circuits each having a driver transistor and a load, a wiring for connecting an interconnection point between the driver transistor and the load of each serial circuit to a gate electrode of the driver transistor of the other serial circuit, and a transfer transistor connected to each interconnection point, wherein the two driver transistors and two transfer transistors are each formed by a MISFET having a channel region formed in an active region of a first conductivity type in a surface of a semiconductor substrate, source and drain regions formed on both sides of the channel region, and an insulated gate electrode formed over the channel region, the SRAM semiconductor device including: a pair of wirings containing impurities of a second conductivity type opposite to the first conductivity type, each of the wirings being directly formed on part of a surface of the active region where the two driver transistors are formed; and a double-diffused drain (DDD) structure MISFET having a channel region defined in an active region of the first conductivity type in the surface of the semiconductor substrate, source and drain regions of a DDD structure formed on both sides of the channel region and having shallow source and drain regions and deep source and drain regions enveloping said shallow source and drain regions, and an insulated gate electrode formed over the channel region, and wherein regions where one of the source and drain regions of the two driver transistors, which is connected to the wiring, is formed to overlap the wiring from an end thereof, and a length of a portion of the source and drain regions overlapping the wiring is substantially the same as a length of a portion of the deep source and drain regions of the DDD structure overlapping the insulated gate electrode from an end thereof.

A low resistivity region doped with impurities and connected to a wiring directly formed on the surface of a semiconductor substrate adjacent to the low resistivity region, is formed by the same process of forming deep source and drain regions of a DDD structure. Impurities having a relatively large diffusion coefficient may be doped in the deep source and drain regions of the DDD structure. Therefore, impurities in the low resistivity region diffuse deeply and at the same time creep under and overlap the wiring. As a result, the connection area of the wiring and low resistivity region becomes large and the contact resistance can be lowered.

If the connection structure of the wiring and low resistance region is applied to the connection structure of a wiring and source and drain regions of a driver transistor of an SRAM semiconductor device, one of the source and drain regions of the driver transistor can be connected to a constant potential with a low contact resistance. It is therefore possible to provide an SRAM capable of reliably operating even at a low supply voltage.

If a DDD type MISFET is formed on the same chip, the semiconductor device capable of reliably operating at a low voltage can be formed by changing mask patterns without increasing the number of manufacturing processes.

As described above, a low resistivity region doped with impurities and a wiring directly formed on the surface of the semiconductor substrate adjacent to the low resistivity region can be electrically connected with a low contact resistance. Accordingly, it becomes possible to provide a semiconductor device capable of reliably operating even at a low voltage.

DETAILED DESCRIPTION OF THE PREFERRED EMBODIMENTS

The inventor has estimated the reason for an unstable operation of an integrated circuit at a low voltage to be ascribed to a large contact resistance between a wiring and a low resistivity region. The wiring is made of polycrystalline silicon or other materials and formed by the same process as that of forming a gate electrode of a MISFET, and the low resistivity region is formed thereafter by ion implantation.

Referring to FIGS. 1A to 1D, conventional connection structures between a wiring and a low resistivity region will first be described, and then connection structures between a wiring and a low resistivity region according to embodiments of the invention will be described.

Figure 1A:
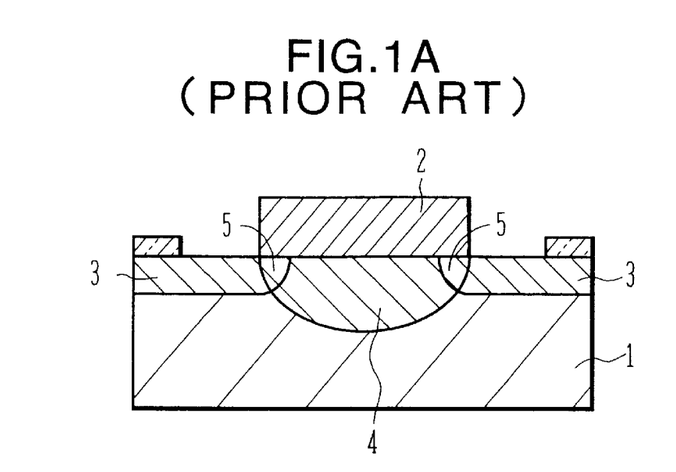
FIGS. 1A to 1D are cross sectional views of substrates illustrating the structures of connection between a wiring and a low resistivity region.

FIG. 1A is a cross sectional view of a substrate showing the conventional connection structure between a wiring and a low resistivity region. A wiring 2 of polycrystalline silicon is formed on the surface of a semiconductor substrate 1. The wiring 2 is formed by the same process as that of forming a gate electrode of a MISFET on another region of the substrate 1. An outwardly diffused or oozed diffusion region 4 is formed just under the wiring 2 by outward diffusion of impurities from the wiring 2 to the substrate 1 by heat treatment performed after the wiring 2 was formed.

Low resistivity regions 3 are formed on both the sides of the wiring 2 by ion implantation. The low resistivity region 3 may be formed at the same time when the source and drain regions of MISFET are formed together with the doping of a polycrystalline silicon gate. Since ion implantation is performed after the wiring 2 was formed, no low resistivity region is formed just under the wiring 2. However, in addition to a small lateral diffusion at the time of ion implantation, later heat treatment causes impurities to diffuse in the lateral direction. This lateral diffusion region overlaps the oozed diffusion region 4.

The wiring 2 and the low resistivity regions 3 are electrically connected together by an overlap region 5 of the low resistivity region 3 and oozed diffusion region 4. If thermal hysteresis is different, diffusion of the oozed diffusion region 4 and low resistivity region 3 becomes different. If the area of the overlap region 5 becomes small because of variation of diffusion, the contact resistance becomes high.

The source and drain regions of a transistor, particularly in recent semiconductor devices with very fine patterns, are made shallow in order to alleviate the short channel effect. There is therefore a tendency that the resistance of the overlap region 5 is becoming smaller and smaller.

Figure 1B:
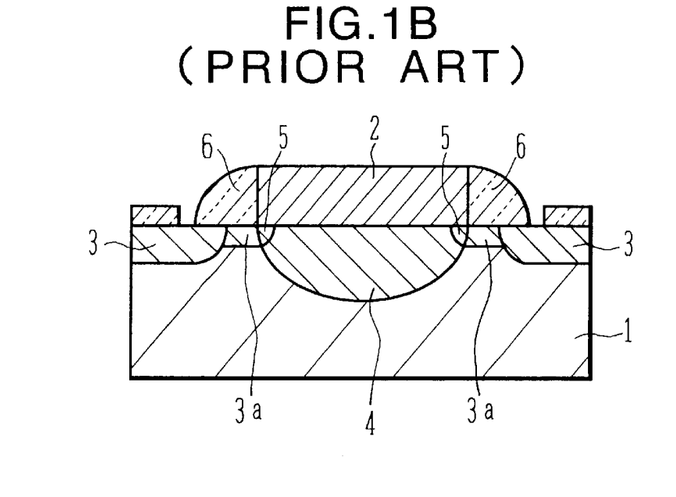

FIG. 1B shows the conventional connection structure between a wiring and a low resistivity region wherein a MISFET of a lightly doped drain (LDD) structure is formed in another region of the semiconductor substrate.

A wiring and low resistivity regions on both the sides of the wiring are formed by the same processes as those of forming a gate electrode and source and drain regions of MISFET of the LDD structure. Side wall regions 6 are therefore formed on the side walls of the wiring layer 2. A low concentration region 3a having an impurity concentration lower than the low resistivity region 3 is therefore formed just under the side wall 6.

The contact resistance becomes high because the low concentration region 3a is serially inserted between the wiring 2 and low resistivity region 3. As described above, if an LDD structure is formed in the same substrate, the contact resistance becomes higher than the case explained with FIG. 1A. As semiconductor devices are made finer and finer, an LDD structure is often used so as not to deteriorate the device performance by hot electrons. An increase of the contact resistance between the wiring 2 and low resistivity region 3 may become a significant issue.

Next, with reference to FIGS. 1C and 1D, the fundamental structure according to embodiments of the invention will be described.

Figure 1C:
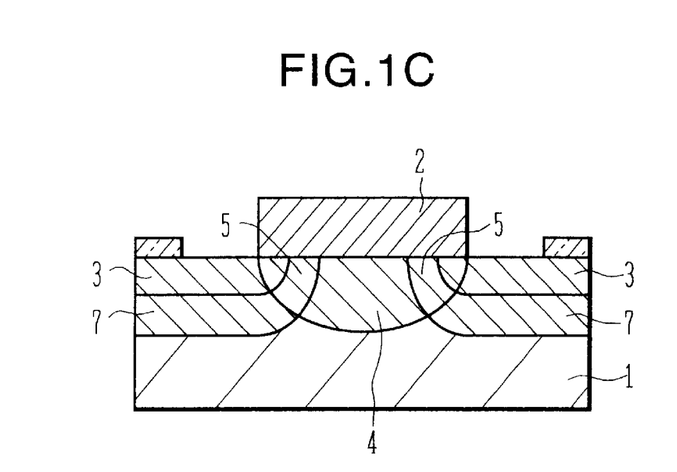

FIG. 1C shows a fundamental structure wherein a usual MISFET is formed in the same substrate. A deeper low resistivity region 7 is formed under a low resistivity region 3, the former region 7 enveloping or surrounding the latter region 3. Other structures are similar to those in FIG. 1A.

Figure 1D:
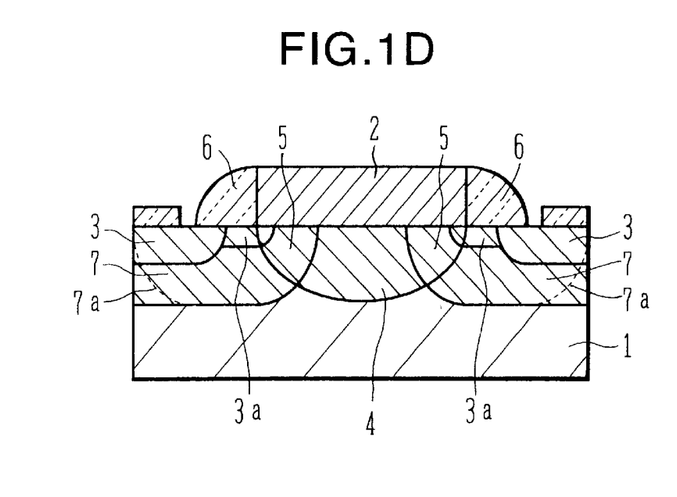

FIG. 1D shows another fundamental structure wherein a MISFET of an LDD structure is formed in the same substrate. Similar to FIG. 1C, a deeper low resistivity region 7 is formed under a low resistivity region 3, the former region 7 enclosing or surrounding the latter region 3. Other structures are similar to those in FIG. 1B.

The deeper low resistivity regions 7 shown in FIGS. 1C and 1D may be formed by doping impurities having a larger diffusion coefficient than that for the low resistivity regions 3, by doping impurities at different dose, or by subjecting them to thermal hysteresis more often than the low resistivity regions 3. The deeper low resistivity regions 7 can be formed by the same process as that of forming deep source and drain regions of a MISFET of double-diffused drain (DDD) structure if such MISFET is formed in the same substrate. Regions formed by the same process have equal depths and lateral diffusion lengths within a process tolerance. In this specification, this equality is called "substantially the same".

As described above, by forming the deeper low resistivity region 7 in the region adjacent to the wiring 2, an overlap region 5 between an outwardly diffused or oozed diffusion region 4 and a low resistivity region formed adjacent thereto can be made large. The contact resistance is considered to be increased correspondingly.

A monitor circuit was manufactured and resistance values were measured in order to evaluate the effects of reducing a contact resistance of the connection structure shown in FIG. 1D.

Figure 2:
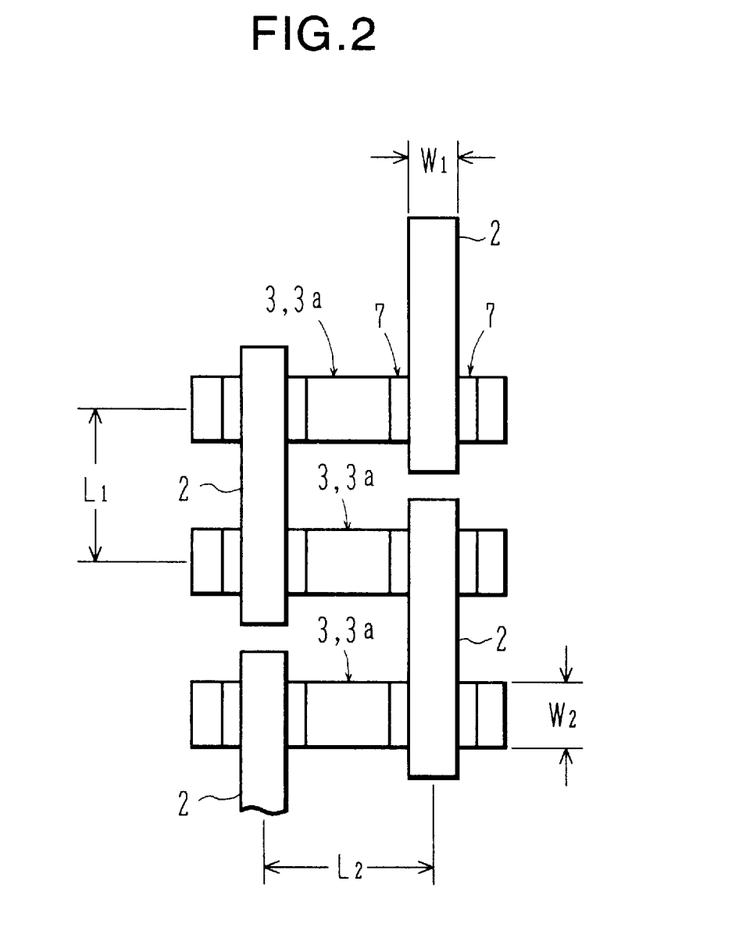
FIG. 2 is a layout of a monitor circuit manufactured for evaluating embodiments of the invention.

FIG. 2 is a plan view showing the layout of the monitor circuit for evaluating the effects of reducing a contact resistance. Wirings 2 and low resistivity regions 3 and 3a are alternately and serially connected as shown in FIG. 2. A deeper low resistivity region 7 such as shown in FIG. 1D is being formed at the connection region between the wiring 2 and low resistivity region 3 and 3a. Side wall oxide are not shown in the figure.

The wiring 2 is of a two-layer structure made of polycrystalline silicon layer having a thickness of 0.1 $\mu$m and tungsten silicide layer having a thickness of 0.1 $\mu$m. A length $L_1$ from one center of the connection region of the wiring 2 to the adjacent center is 3.4 $\mu$m and a width $W_1$ of the wiring 2 is 0.75 $\mu$m. A length $L_2$ from one center of the connection region under the wiring 2 to the center of the adjacent wiring 2 is 3.3 $\mu$m and a width $W_2$ of the low resistivity regions 3 and 3a parallel to the wiring 2 is 1.0 $\mu$m.

Next, with reference to FIG. 1D, the conditions of forming each low resistivity region will be described. The oozed diffusion region 4 was formed by implanting phosphorus (P) ions into the wiring 2 at an acceleration energy of 40 keV and at a dose of $6\times10^{15}$ cm$^{-2}$ and thereafter by performing heat treatment twice at 900° C. for 10 minutes.

The low resistivity region 7 was formed by implanting phosphorus (P) at an acceleration energy of 40 keV and at a dose of $3\times10^{15}$ cm$^{-2}$, and the low resistivity region 3a was formed by implanting phosphorus (P) at an acceleration energy of 40 keV and at a dose of $4\times10^{13}$ cm$^{-2}$. The low resistivity region 3a was formed by implanting arsenic (As) at an acceleration energy of 50 keV and at a dose of $4\times10^{15}$ cm$^{-2}$. Each region was activated by performing heat treatment twice at 900° C. for 10 minutes. As indicated by broken lines 7a shown in FIG. 1D, the low resistivity region 7 was formed by implanting ions only in the regions having a width of 0.2 $\mu$m from both the ends of the wiring 2.

The side walls 6 were formed by depositing an oxide film having a thickness of 0.2 $\mu$m by chemical vapor deposition (CVD) and anisotropically etching it.

The monitor circuit shown in FIG. 2 having 50 connection regions, including 26 wirings 2 and 25 low resistive regions 7, was manufactured, and the resistance value across both the ends of the monitor circuit was measured. The resistance value of the monitor circuit was 15 k$\Omega$. The resistance of one wiring 2 was about 70$\Omega$ and the resistance of one low resistivity region was about 230$\Omega$. It is therefore understood that the resistance at one connection region between the wiring 2 and low resistivity region is about 150$\Omega$.

A similar monitor circuit having the connection structure of FIG. 1B was manufactured. The resistance at one connection region was about 250$\Omega$. It was found therefore that the resistance at the connection region could be lowered by about 40% by forming the deep low resistance region such as shown in FIG. 1C or 1D.

An embodiment which applies the fundamental structure shown in FIG. 1C to an SRAM cell will be described.

Figure 3A:
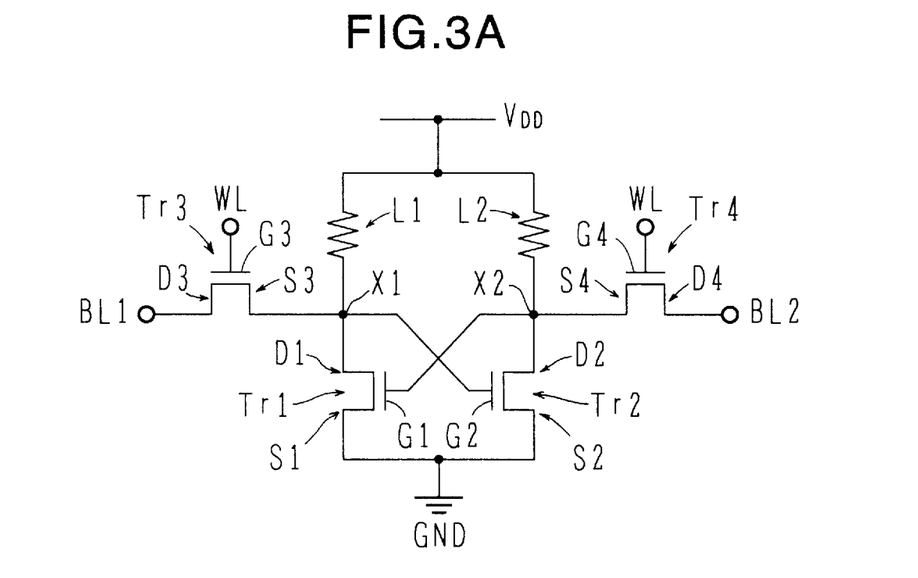
FIGS. 3A and 3B are a circuit diagram of an SRAM cell to which the connection structure of an embodiment of the invention is applied, and a plan view of the SRAM cell on a semiconductor substrate.
Figure 3B:
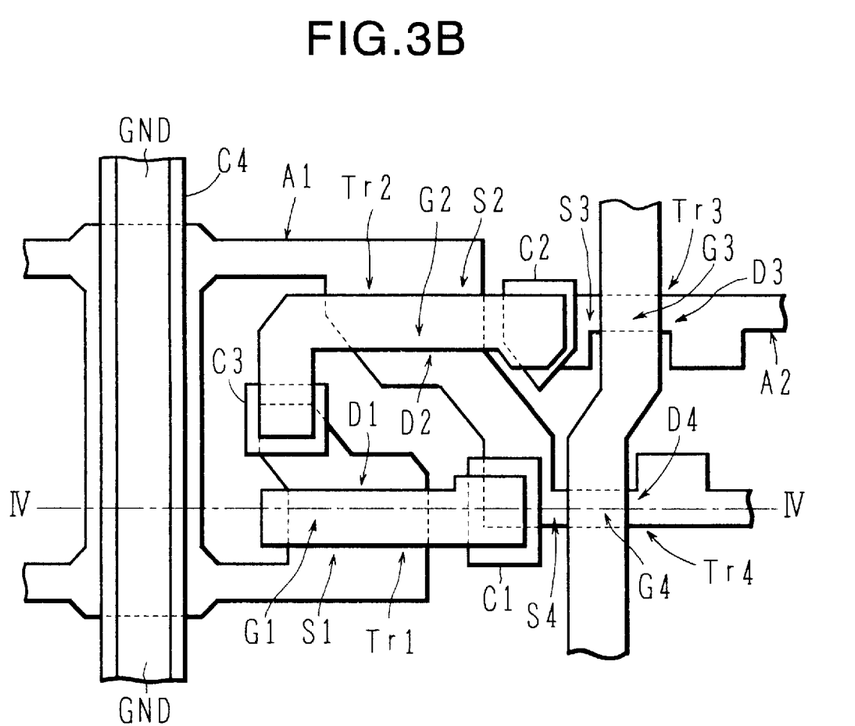

FIG. 3A is an equivalent circuit of an SRAM cell, and FIG. 3B is a plan view showing a layout of the circuit of FIG. 3A formed on a substrate.

As shown in FIG. 3A, a load resistor L1 is serially connected to the drain terminal D1 of a driver transistor Tr1 to constitute a serial circuit. A terminal of this serial circuit on the load resistor L1 side is connected to a power source voltage $V_{DD}$, and the source terminal S1 of the driver transistor Tr1 is connected to ground potential GND. Similarly, a serial circuit of a load resistor L2 and a driver transistor Tr2 is formed and connected across the power source voltage $V_{DD}$ and ground potential GND.

An interconnection point X1 between the drain terminal D1 of the driver transistor Tr1 and the load resistor L1 is connected to the gate electrode G2 of the other driver transistor Tr2. An interconnection point X2 between the drain terminal D2 of the driver transistor Tr2 and the load resistor L2 is connected to the gate electrode G1 of the other driver transistor Tr1.

The interconnection point X1 is also connected via a transfer transistor Tr3 to a bit line BL1. Similarly, the interconnection point X2 is also connected via a transfer transistor Tr4 to a bit line BL2. Both the gate electrodes G3 and G4 of the transfer transistors Tr3 and Tr4 are connected to a word line WL. The terminals of the transfer transistors Tr3 and Tr4 connected to the interconnection points X1 and X2 are called source terminals S3 and S4, and the terminals thereof connected to the bit lines BL1 and BL2 are called drain terminals D3 and D4 in the specification.

As shown in FIG. 3B, active regions A1 and A2 are defined by a field oxide film formed on the surface of a silicon substrate. The driver transistors Tr1 and Tr2 and transfer transistor Tr4 are formed in the active region A1, and the transfer transistor Tr3 is formed in the active region A2. The gate, source, and drain of each transistor is represented by using the same reference symbols (character and number) as those of a corresponding terminal shown in FIG. 3A.

The gate electrode G1 of the driver transistor Tr1 is connected at a connection region C1 to the source region S4 of the transfer transistor Tr4 and to the drain region D2 of the driver transistor Tr2. The connection region is a region where the surface of the silicon substrate is exposed by removing the gate oxide film formed on the surface of the active region.

The gate electrode G2 of the driver transistor Tr2 is connected at a connection region C2 to the source region S3 of the transfer transistor Tr3, and at a connection region C3 to the drain region D1 of the driver transistor Tr1. The source regions S1 and S2 of the driver transistors Tr1 and Tr2 are connected at a connection region C4 to a ground line GND.

Although not shown in FIG. 3B, the load resistors L1 and L2 are formed over an interlayer insulating film along the gate electrodes G1 and G2. One ends of the load resistors L1 and L2 are connected to the gate electrodes G1 and G2 near the connection regions C1 and C2. The other ends of the load resistors L1 and L2 are connected to a power source line formed in the same layer as the resistors L1 and L2 along the GND line.

Bit lines are formed in the lateral direction of FIG. 3B over an interlayer insulating film covering the load resistors L1 and L2 and power source line, along the gate electrodes G1 and G2. The bit lines are connected to the drain regions D3 and D4 of the transfer transistors Tr3 and Tr4 via contact holes.

The fundamental structure shown in FIG. 1C is utilized at the connection regions C1 to C4 of FIG. 3B.

Next, with reference to FIGS. 4A to 4E, a method of manufacturing an SRAM cell such as shown in FIG. 3B will be described. FIGS. 4A to 4E are cross sectional views taken along one-dot chain line IV—IV of FIG. 3B. A cross sectional view explaining the process of forming a MOSFET Tr5 of a DDD structure in another region of the same substrate is shown, by reference, at the right side of each cross sectional view.

Figure 4A:
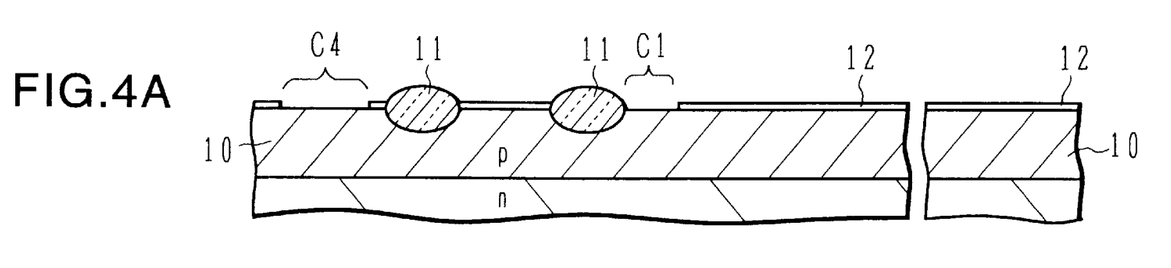
FIGS. 4A to 4E are cross sectional views of a substrate taken along one-dot chain line IV—IV of FIG. 3B, explaining the processes of a method of manufacturing an SRAM cell by applying the connection structure of an embodiment of the invention.

FIG. 4A is a cross sectional view of a substrate after a process of forming openings of connection regions. A p-type well 10 is first formed on an n-type silicon substrate.

Although only a p-type well is formed, other wells may also be formed. Isolating oxide regions 11 are formed to a film thickness of about 400 to 500 nm at predetermined areas by local oxidation.

An SiN film used as a mask for local oxidation is removed, and the surface of the exposed p-type well 10 is thermally oxidated to form a gate oxide film 12 to a thickness of about 20 nm. The gate oxide film 12 at the regions corresponding to connection regions C1 and C4 is removed by utilizing photolithography. In the above manner, the connection regions C1 and C4 are defined.

Figure 4B:
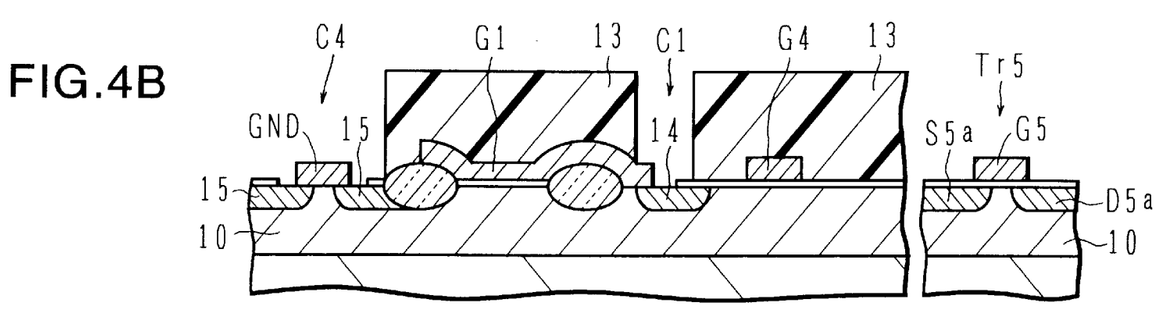

FIG. 4B is a cross sectional view of the substrate after a process of implanting ions for deep source and drain regions of a transistor having a DDD structure. A polycrystalline silicon layer is deposited to a thickness of about 300 nm over the whole surface of the substrate by CVD. Next, phosphorus ions are implanted in the polycrystalline silicon layer at an acceleration energy of 30 to 70 keV and at a dose of $1 \times 10^{15}$ to $10 \times 10^{15}$ cm$^{-2}$.

The polycrystalline silicon layer is patterned to form the gate electrode G1 of the driver transistor Tr1, the gate electrode G4 of the transfer transistor Tr4, and the ground line GND at the connection region C4. At this time, the gate electrode G5 of MOSFET having a DDD structure is formed.

Instead of the polycrystalline silicon layer, a two-layer structure of a polycrystalline silicon layer and a tungsten silicide layer may be used. For example, a polycrystalline silicon layer is deposited to a thickness of 100 nm, and a tungsten silicide layer is deposited thereon to a thickness of 100 nm.

Other layers may also be used for the conductive layer G, which include a single layer structure of an amorphous silicon layer, a two-layer structure of a polycrystalline silicon layer and a silicide layer, a three-layer structure of an amorphous silicon layer, a polycrystalline silicon layer, and a silicide layer, a three-layer structure of a polycrystalline silicon layer, a silicide layer, and an amorphous silicon layer, and a four-layer structure of an amorphous silicon layer, a polycrystalline silicon layer, a silicide layer, and another amorphous silicon layer.

The region of MOSFET with the DDD structure and the connection regions C1 and C4 are exposed, and other regions are covered with a resist pattern 13. Next, by using the resist pattern 13 as a mask, impurity ions are implanted for forming the source and drain regions of MOSFET Tr5 with the DDD structure. In this ion implantation, impurity ions having a larger diffusion coefficient among the two kinds of impurities for the source and drain regions are used. For example, phosphorus ions are implanted at an acceleration energy of 30 to 70 keV and a dose of $1 \times 10^{15}$ to $5 \times 10^{15}$ cm$^{-2}$. With this impurity ion implantation, the deep source and drain regions S5a and D5a of MOSFET Tr5 with the DDD structure are formed. At this time, the low resistance regions 14 and 15 are formed at the connection regions C1 and C4.

Figure 4C:
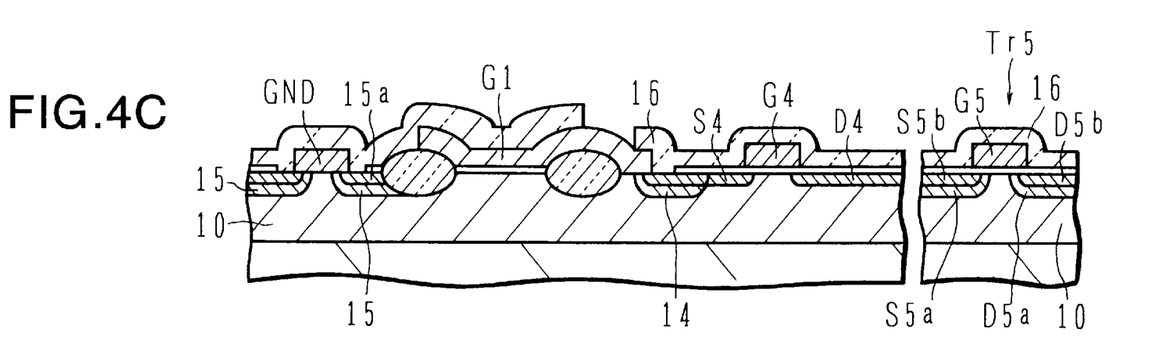

FIG. 4C is a cross sectional view of the substrate after a process of forming shallow source and drain regions of MOSFET with the DDD structure and the source and drain regions of each transistor of the SRAM cell and forming an interlayer insulating film. The resist pattern shown in FIG. 4B is removed. By using the gate electrode of each transistor and the isolating oxide regions as a mask, impurity ions are implanted for forming the shallow source and drain regions of MOSFET with the DDD structure. In this ion implantation, impurity ions having a smaller diffusion coefficient among the two kinds of impurities for the source and drain regions are used. For example, arsenic ions are implanted at an acceleration energy of 30 to 70 keV and a dose of $1 \times 10^{15}$ to $10 \times 10^{15}$ cm$^{-2}$.

With this impurity ion implantation, the shallow source and drain regions S5b and D5b of MOSFET Tr5 with the DDD structure are formed. At this time, the source and drain regions S4 and D4 of the transfer transistor Tr4 and the shallow low resistivity region 15a over the low resistivity region 15 at the connection region C4 are formed. Part of the source region S4 is formed over the low resistivity region 14.

The source and drain regions are formed by the above processes through ion implantation. At this stage, impurities are not still activated, but they are activated by later annealing.

Next, an interlayer insulating film 16 of SiO$_2$ is deposited by CVD on the whole surface of the substrate to a thickness of about 100 nm. A contact via hole is formed by utilizing photolithography to expose the surface of the gate electrode G1 at a predetermined area.

Figure 4D:
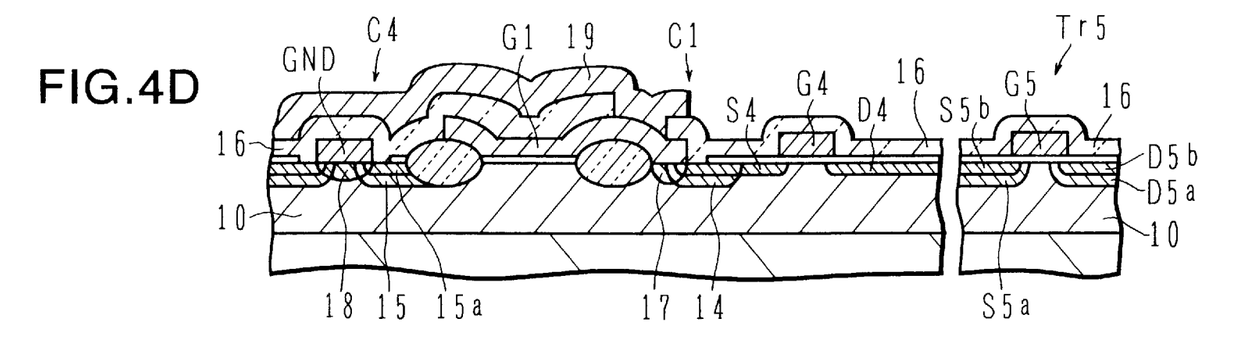

FIG. 4D is a cross sectional view of the substrate after a process of forming load resistors and a power source line. A polycrystalline silicon layer 19 is formed by CVD over the whole surface of the substrate to a thickness of 100 nm. Impurities are doped into the polycrystalline silicon layer 19 at the region where the resistance is to be lowered. In this embodiment, by using a resist pattern as a mask, arsenic ions are implanted into the region along the ground line GND, for example, at an acceleration energy of 30 to 70 keV and a dose of $1 \times 10^{15}$ to $10 \times 10^{15}$ cm$^{-2}$. The lowered resistance region is used as the power source line.

After arsenic ions are implanted, annealing is performed at 900° C. for 10 minutes. This annealing activates the impurity ions implanted by the previous processes. At the region of MOSFET Tr5 with the DDD structure, phosphorus ions having a relatively large diffusion coefficient implanted at the process explained with FIG. 4B are deeply diffused and at the same time activated to thereby form the deep source and drain regions S5a and D5a. In addition, arsenic ions having a relatively small diffusion coefficient implanted at the process explained with FIG. 4C are slightly diffused and at the same time activated to thereby form the shallow source and drain regions S5b and D5b. The source and drain regions S4 and D4 of the transistor Tr4 are also activated.

With this annealing, phosphorus ions in the gate electrode G1 are diffused into the polycrystalline silicon layer 19 near at the connection region C1. Therefore, the gate electrode G1 and polycrystalline silicon layer 19 are electrically connected together by a low resistance region at the connection boarder therebetween.

Also at the connection regions C1 and C4, phosphorus ions implanted at the process explained with FIG. 4B are deeply diffused and activated so that the low resistivity regions 14 and 15 are formed. The low resistivity region 14 partially overlaps the source region S4 and is electrically connected thereto. At the connection region C4, impurities in the low resistivity region 15 are activated. The shallow low resistivity region 15a is connected, as shown in FIG. 3B, to the source region S1 of the driver transistor Tr1. Therefore, the low resistivity region 15 is electrically connected via the shallow low resistivity region 15a to the source region S1.

At the same time, at the connection regions C1 and C4, phosphorus ions in the gate electrode G1 and ground line GND in contact with the p-type well 10 are diffused into the p-type well 10 to thereby form the oozed diffusion regions 17 and 18.

Next, the polycrystalline silicon layer 19 is patterned to form the power source line and load resistors L1 and L2 (FIG. 3A). The power source line is formed along the ground line GND when viewed in the layout of FIG. 3B. One ends of the load resistors L1 and L2 are connected to the gate electrodes G1 and G2 near the connection regions C1 and C2 when viewed in the layout of FIG. 3B, and the other ends are connected to the power source line formed along the ground line GND.

Figure 4E:
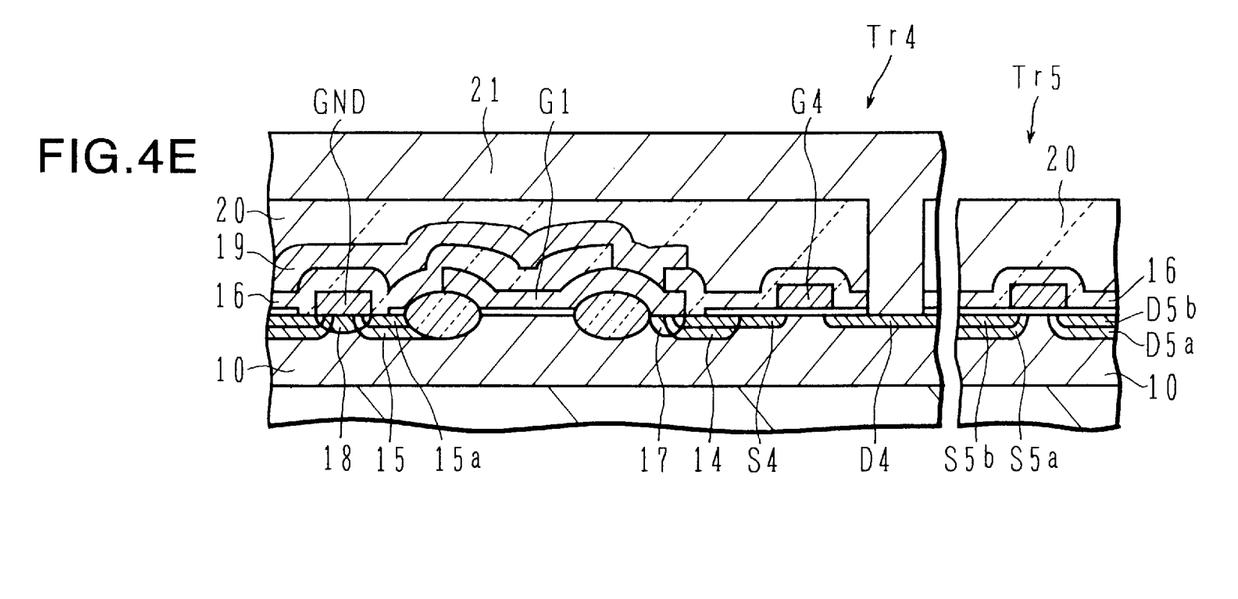

FIG. 4E is a cross sectional view of the substrate after a process of forming bit lines. After the power source line and load resistors are formed by patterning the polycrystalline silicon layer 19, an interlayer insulating film 20 is formed by depositing by CVD an $SiO_2$ film to a thickness of about 100 nm and a phosphorus silicate glass (PSG) film to a thickness of about 500 nm. Reflow is performed thereafter at 900° C. for about 10 minutes to planarize the surface of the interlayer insulating film 20. With this heating, the low resistivity regions 14 and 15 and other regions activated by annealing at the process explained with FIG. 4D are further deeply diffused. Therefore, the contact resistance at the connection regions between the ground line GND and low resistivity region 15 and between the gate electrode G1 and low resistivity region 14 is further lowered.

Next, a contact hole is formed to partially expose the surface of the drain region D4 of the transfer transistor Tr4. An aluminum layer 21 is deposited to a thickness of about 1 $\mu$m by physical vapor deposition (PVD), and patterned to form the bit lines.

With the above processes, the SRAM cell shown in FIG. 3A can be formed.

At the same time when the deep source and drain regions S5$a$ and D5$a$ of the transistor Tr5 with the DDD structure are formed, the low resistivity regions 14 and 15 are formed at the connection regions. Therefore, the overlap regions between the low resistivity regions 14 and 15 and the oozed diffusion regions 17 and 18 just under the wiring and the gate electrode are made large. At the connection region C4 formed by the above processes, the length of the deep low resistivity region 15 creeping under and overlapping the GND line is considered to be about 0.3 to 0.4 $\mu$m, and the length of the shallow low resistivity region 15$a$ creeping under the GND line is considered to be about 0.1 $\mu$m.

Since the overlap regions between the low resistivity regions 14 and 15 and the oozed diffusion regions 17 and 18 can be made larger, the contact resistance between the wiring formed at the same time when the gate electrodes are formed and the low resistivity region formed adjacent to the wiring can be lowered.

In a usual SRAM, transistors with the DDD structure are used for circuits which require a large source/drain breakdown voltage, such as an input protection circuit for preventing electrostatic breakdown and a redundancy circuit with fuses. Such circuits can be manufactured by the SRAM cell manufacturing method explained with FIGS. 4A to 4E without increasing manufacturing steps.

In the above embodiment, after ions are implanted for forming the deep source and drain regions of the DDD structure at the process explained with FIG. 4B, the resist pattern 13 is removed, and immediately thereafter ion implantation is performed for the shallow source and drain regions. Annealing may be performed between the processes of forming the deep and shallow source and drain regions. The deep low resistivity regions 14 and 15 shown in FIG. 4D can be diffused deeper by this annealing. Therefore, the overlap regions between the oozed diffusion regions 17 and 18 and the low resistivity regions 14 and 15 can be made larger and the contact resistance can be further lowered.

If annealing is performed between the processes of implanting impurity ions for the double source and drain regions of the DDD structure, the same species of impurity ions may be used.

The DDD structure may also be formed by vapor phase diffusion or by deposition of diffusion species and drive-in, instead of ion implantation. Also in this case, either two kinds of impurities having different diffusion coefficients may be diffused at the same time, or the same kind of impurities may be diffused twice.

In the method described with FIGS. 4A to 4E, a MOSFET with a single drain structure is used as the transistor of an SRAM cell. A lightly doped drain (LDD) structure may be used. In forming an LDD structure, after the process illustrated in FIG. 4B, the resist pattern 13 is removed and LDD regions are formed before ion implantation is performed for the shallow source and drain regions S5$b$ and D5$b$.

By using the gate electrode of each transistor as a mask, phosphorus ions are implanted at an acceleration energy of 40 keV and at a dose of $4 \times 10^{13}$ cm$^{-2}$. Next, an $SiO_2$ film is deposited to a thickness of about 200 nm by CVD, and anisotropically etched by reactive ion etching or other methods to form side wall oxide regions on the side walls of the gate electrodes. Thereafter, the processes same as the process illustrated in FIG. 4C and the following process are performed.

The LDD structure can prevent a device performance from being deteriorated by the hot electron effect accompanied by fine pattern devices.

In the methods explained with FIGS. 4A to 4E, impurities implanted in the deep source and drain regions of the DDD structure are also implanted to all the connection regions. Impurities may be implanted only into limited connection regions. For example, impurities may be implanted only into the connection region C4 at which the ground line GND is connected.

For example, the low resistivity region 14 shown in FIG. 4E is formed also at the partial area of the source region S4. It is conceivable that the shape of the source region may change and the transistor characteristics may be adversely affected.

The connection regions C1, C2, and C3 shown in FIG. 3B overlap the isolating oxide regions. Therefore, impurity ions for forming the low resistance region are also implanted into the area near the boarder between the active region A1 and the isolating oxide region. Impurities implanted into the area near the boarder creep under the isolating oxide region at the later annealing. Therefore, the isolation function may be damaged. To solve these possible problems, deep ion implantation can be arranged not to be performed at the connection regions C1, C2, and C3.

As above, although the embodiment of the invention lowers the contact resistance between a wiring and a low resistivity region, the adverse effect may occur depending on a connection region where ions are implanted. Whether or not the embodiment of the invention is applied, is preferably determined from a trade-off between the lowered resistance and the adverse effect at each connection region.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device, comprising the steps of:
   (a) preparing a semiconductor substrate having an active region of a first conductivity type;
   (b) forming a gate oxide film on a surface of said active region;
   (c) selectivity removing said gate oxide film and forming a first connection region where a surface of said semiconductor substrate is exposed;
   (d) forming a conductive film including impurities of a second conductivity type opposite to the first conductivity type on said semiconductor substrate, patterning said conductive film, and forming a first gate electrode on said gate oxide film and a first wiring on said first connection region;
   (e) forming a resist pattern exposing a transistor forming region including said first gate electrode and said first connection region and implanting first impurity ions of the second conductivity type by using a mask said resist pattern, said first gate electrode and said first wiring;
   (f) implanting second impurity ions of the second conductivity type into the transistor forming region including said first gate electrode by using as a mask said first gate electrode; and
   (g) annealing said semiconductor substrate to activate said first and second impurity ions and diffuse impurities in said first wiring of said conductive film into said semiconductor substrate at said first connection region, wherein said semiconductor device comprises an SRAM cell including a pair of driver transistors, a pair of transfer transistors, and a plurality of interconnection wirings between said transistors, and a peripheral circuit including a MISFET of a double-diffused drain (DDD) structure.

2. A method according to claim 1, wherein said second impurity ions have a smaller diffusion coefficient than said first impurity ions.

3. A method of manufacturing a semiconductor device according to claim 1, wherein the first gate electrode formed in said step (d) is a gate electrode of said MISFET of the DDD structure, and the first wiring formed in said step (d) constitutes said interconnection wiring.

4. A method of manufacturing a semiconductor device according to claim 3, wherein said first wiring connects each one current electrode of said pair of driver transistors.

5. A method of manufacturing a semiconductor device according to claim 3, wherein said step (d) further forms second and third gate electrodes for said pair of driver transistors and fourth and fifth gate electrodes for said pair of transfer transistors.

6. A method of manufacturing a semiconductor device according to claim 5, wherein said first wiring is formed on one current electrode region of one of said pair of driver transistors having said second gate electrode, and said third gate electrode extends to be continuous to said first wiring.

7. A method of manufacturing a semiconductor device according to claim 5, wherein said step (c) further forms second, third and fourth connection regions, said step (d) further forms second, third and fourth wirings on said second, third and fourth connection regions.

8. A method of manufacturing a semiconductor device according to claim 7, wherein said second gate electrode extends to be continuous to said second wiring and said third gate electrode extends to be continuous to said third and fourth wirings.

9. A method of manufacturing a semiconductor device according to claim 8, wherein said second and third connection regions are part of current electrodes of said pair of driver transistors and said fourth connection region is part of a current electrode of one of said transfer transistors.

10. A method of manufacturing a semiconductor device including a first MISFET of a double-diffused drain (DDD) structure and a second MISFET of a lightly doped drain (LDD) structure with a shallow source/drain structure, the method comprising the steps of:
    (a) preparing a semiconductor substrate having a surface region of a first conductivity type;
    (b) forming a gate oxide film on said surface region;
    (c) selectively removing said gate oxide film to partially expose said surface region of the first conductivity type and define a first connection region;
    (d) forming a conductive film containing impurities of a second conductivity type opposite to the first conductivity type on said semiconductor substrate;
    (e) patterning said conductive film to form first and second gate electrodes of the first and second MISFETs on said gate oxide film and a first wiring on said first connection region;
    (f) forming a first mask on a surface of said semiconductor substrate, said first mask having openings at areas corresponding to said first gate electrode of the first MISFET and said first wiring;
    (g) implanting impurity ions of the second conductivity type twice into the surface of said semiconductor substrate by using as a mask said first mask, said first gate electrode of the first MISFET and said first wiring;
    (h) forming a second mask on a surface of said semiconductor substrate, said second mask having openings at areas corresponding to said second gate electrode of the second MISFET and said first wiring;
    (i) implanting impurity ions of the second conductivity type into the surface of said semiconductor substrate to a first shallow depth by using as a mask said second mask, said second gate electrode of the second MISFET, and said first wiring;
    (j) forming side wall insulating regions on side walls of said first wiring and on side walls of said second gate electrode of the second MISFET;
    (k) implanting impurity ions of the second conductivity type to a second depth deeper than the first depth by using as a mask said first wiring, said second gate electrode of the second MISFET, and said side wall insulating regions; and
    (l) activating and diffusing the implanted impurity ions.

11. A method of manufacturing a semiconductor device according to claim 10, wherein said step (g) is performed partly before step (h) and partly after said step (j).

12. A method of manufacturing a semiconductor device according to claim 10, wherein said semiconductor device comprises an SRAM cell including a pair of driver transistors, a pair of transfer transistors, and a plurality of interconnection wirings between said transistors, said driver transistor and said transfer transistor including said second MISFET of the LDD structure, and a peripheral circuit including said first MISFET of the DDD structure.

13. A method of manufacturing a semiconductor device according to claim 12, wherein the first wiring formed in said step (e) constitutes said interconnection wiring.

14. A method of manufacturing a semiconductor device according to claim 12, wherein said first wiring connects each one current electrode of said pair of driver transistors.

15. A method of manufacturing a semiconductor device according to claim 12, wherein said step (e) forms the second gate electrode and a third gate electrode for said pair of driver transistors and a fourth gate electrode and a fifth gate electrode for said pair of transfer transistors.

16. A method of manufacturing a semiconductor device according to claim 15, wherein said first wiring is formed on one current electrode region of said second driver transistor having said second gate electrode, and said third gate electrode extends to be continuous to said first wiring.

17. A method of manufacturing a semiconductor device according to claim 15, wherein said step (c) further forms second, third and fourth connection regions, said step (e) further forms second, third and fourth wirings on said second, third and fourth connection regions.

18. A method of manufacturing a semiconductor device according to claim 17, wherein said second gate electrode extends to be continuous to said second wiring and said third gate electrode extends to be continuous to said third and fourth wirings.

19. A method of manufacturing a semiconductor device according to claim 18, wherein said second and third connection regions are part of current electrodes of said pair of driver transistors and said fourth connection region is part of a current electrode of one of said transfer transistors.

20. A method of manufacturing an SRAM semiconductor device having an SRAM cell and a peripheral circuit including a MISFET of a double-diffused drain (DDD) structure, the SRAM cell having two serial circuits, each with a driver transistor and a load, connected between a pair of power source lines, and an interconnection point between the driver transistor and the load of each serial circuit being connected to a gate electrode of a driver transistor of the other serial circuit, the method comprising the steps of:

forming a gate oxide film on a surface of a semiconductor substrate having an active region of a first conductivity type;

selectively removing said gate oxide film to form connection regions where a surface of said semiconductor substrate is exposed;

forming a conductive film containing impurities of a second conductivity type opposite to the first conductivity type on said semiconductor substrate, and patterning said conductive film, to form gate electrodes of the driver transistors and the MISFET of the DDD structure on some regions of said active region through said gate oxide film, and wirings on said connection regions;

forming a resist pattern exposing a transistor forming region including said gate electrode of the MISFET of the DDD structure and said connection regions, and implanting impurity ions of the second conductivity type twice by using as a mask said resist pattern, said gate electrode of the MISFET of the DDD structure and said wiring;

forming a resist pattern exposing transistor forming regions including said gate electrode of the driver transistors and said connection regions, and implanting impurity ions of the second conductivity type by using as a mask said resist pattern, said gate electrode of the driver transistors and said wirings; and annealing said semiconductor substrate to activate the implanted impurity ions and diffuse the impurities in said wirings of said conductive film into said semiconductor substrate at said connection regions.

* * * * *